United States Patent [19]

Yilmaz

[11] Patent Number: 4,682,195

[45] Date of Patent: Jul. 21, 1987

[54] INSULATED GATE DEVICE WITH CONFIGURED EMITTER CONTACT PAD

[75] Inventor: Hamza Yilmaz, Dewitt, N.Y.

[73] Assignee: General Electric Company, Research Triangle Park, N.C.

[21] Appl. No.: 781,383

[22] Filed: Sep. 30, 1985

[51] Int. Cl.⁴ .......................................... H01L 29/78
[52] U.S. Cl. ................................ 357/23.4; 357/23.14; 357/41; 357/52; 357/68
[58] Field of Search ................... 357/23.4, 23.14, 41, 357/52, 68

[56] References Cited

U.S. PATENT DOCUMENTS

| 4,532,534 | 7/1985 | Ford et al. | 357/23.4 |
| 4,593,302 | 6/1986 | Lidow et al. | 357/23.4 |
| 4,631,564 | 12/1986 | Neilson et al. | 357/23.4 |

FOREIGN PATENT DOCUMENTS

| 57-206073 | 12/1982 | Japan | 357/23.4 |
| 58-100460 | 6/1983 | Japan | 357/23.4 |
| 60-43862 | 3/1985 | Japan | 357/23.4 |

Primary Examiner—Joseph E. Clawson, Jr.
Attorney, Agent, or Firm—Stanley C. Corwin; Birgit E. Morris

[57] ABSTRACT

The construction of a semiconductor insulated gate device (IGT) is altered to avoid cell latching problems assisted with "hot spot" sites where an atypically high density reverse current tends to flow. IGT cells adjacent these sites are totally or partially disabled by eliminating emitter regions therein to thereby remove any emitter-base junctions from the paths along which the high density reverse current flows. Also the area of emitter electrode ohmic contact is increased at these "hot spot" sites to effectively divert reverse from neighboring, forward current conducting, active cells and thus reduce the density of reverse flow therethrough to safe levels.

1 Claim, 5 Drawing Figures

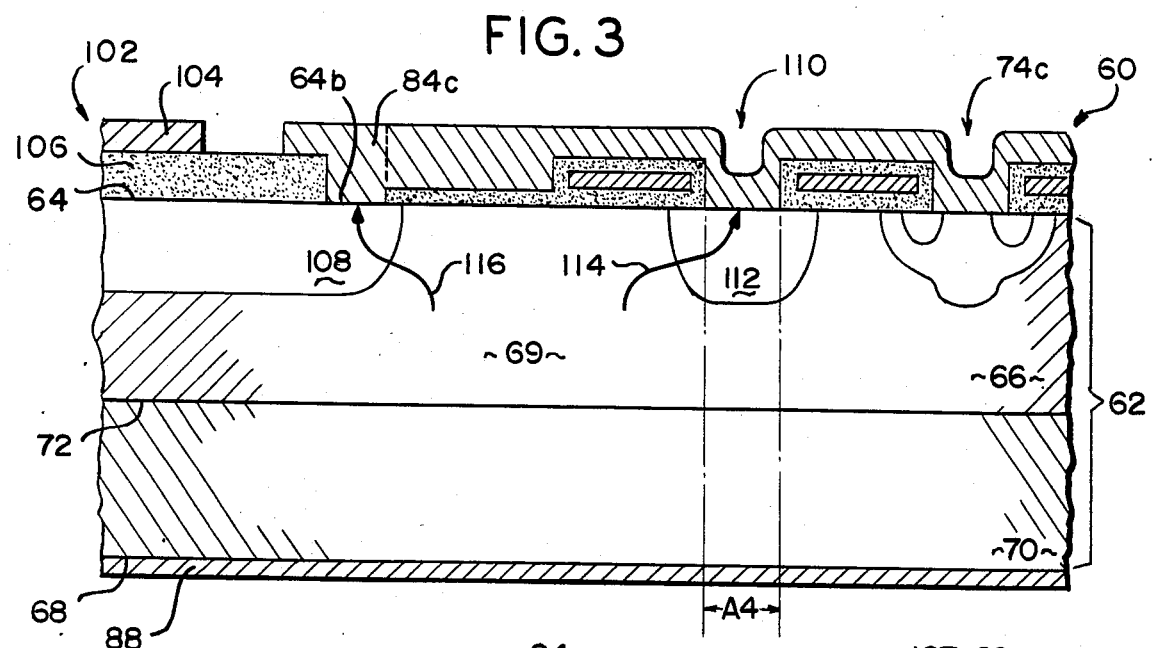
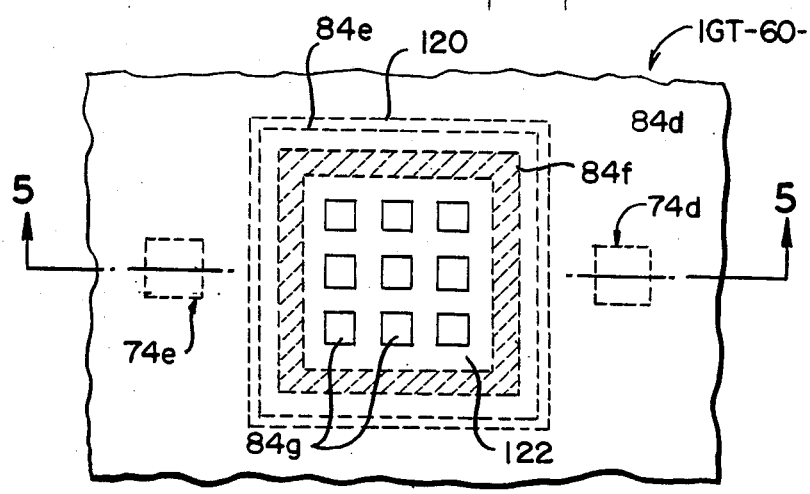
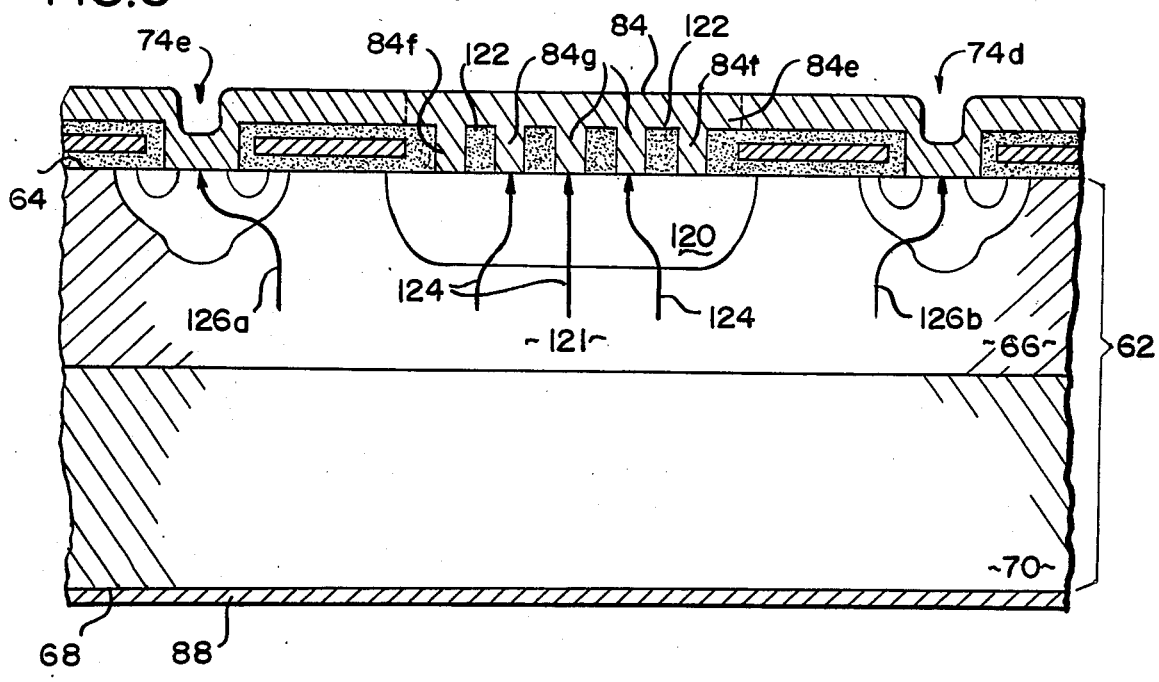

INSULATED GATE DEVICE WITH CONFIGURED EMITTER CONTACT PAD

The present invention relates in general to semiconductor devices and in particular to the structure of an insulated gate semiconductor device.

BACKGROUND OF THE INVENTION

A typical insulated gate device (IGD) is the insulated gate transistor (IGT), a device capable of controlling a high forward current with a low bias voltage applied to its gate electrode. This gate control characteristic makes the IGT particularly useful for power control and current switching applications.

A typical IGT is implemented on a silicon semiconductor wafer. This wafer includes a distributed drift layer of a first conductivity type overlain by a major wafer surface. This drift layer is underlain by an adjoining, distributed collector region of a second conductivity type. A plurality of cells are situated in the wafer for conducting a main device current, each cell comprising a base region of a second conductivity type extending from the major surface into the drift region, and an emitter region of the first conductivity type extending from the major surface into the base region. Each cell emitter region is spaced from the distributed drift region so as to form a channel in an intervening portion of the cell base region.

A distributed gate electrode is insulatingly spaced from the major surface of the wafer and overlies each cell channel, such that a bias voltage applied to the gate electrode causes an electrical field to be developed for controlling the magnitude of a main device current flowing through the channel. Distributed emitter and collector electrodes are connected, respectively, at opposite ends of each cell, and conduct the main device current into and out of the cells. A typical collector electrode comprises a conductive layer disposed in continuous ohmic contact with the distributed collector region. A typical emitter electrode comprises a conductive layer disposed in ohmic contact with emitter and base region surfaces of each cell exposed at the major surface of the wafer.

As is known to those skilled in the art, the emitter, base and drift regions of the typical IGT cell form a first, inherent bipolar transistor, while the base, drift and collector regions form a second, inherent bipolar transistor. These first and second inherent bipolar transistors have respective forward a current gains of α1 and α2, and by the nature of their construction are regeneratively coupled to form a parasitic thyristor. This paraisitic thyristor is susceptible to latching when the sum of the forward current gains of the two bipolar transistors equals or exceeds unity. When this parasitic thyristor latches, the IGT loses gate control of the forward current, and can only be turned off through an external action such as commutation.

As is further known to those skilled in the art, one cause of parasitic thyristor latching is a reverse current flow of minority carriers through the base region of a cell adjacent the emitter-base junction of the first bipolar transistor. This reverse current, whose magnitude increases as the main device (forward) current increases, causes a voltage drop to develop along the emitter-base junction which, when it exceeds a threshold voltage, forward biases the junction and causes the forward current gain of the first bipolar transistor to substantially increase. Hence the sum of the forward current gains of the first and second inherent bipolar transistors has a high probability of exceeding unit and causing the parasitic thyristor to latch. Because the active cells are parallel connected, when the parasitic thyristor in any one cell latches, the remainder also latch and the IGT loses gate control of the forward current.

It has been discovered by the present inventor that, due to certain structural characteristics, a typical IGT contains "hot spots", or sites where there is a disproportionately high density of reverse current in comparison to the remainder of the device. Cells situated in the vicinity of these hot spots experience an unusually high density of reverse current flow adjacent their emitter-base junctions and, for the reasons described above, have more of a tendency to go into a latched, uncontrollable state of operation than do the other cells in the IGT.

Specifically, these hot spots have been discovered at three sites in a typical IGT. The first site is that part of the IGT underlying a metal gate electrode spine. As is known to those skilled in the art, a continuous, metallic, gate electrode spine overlays selected portions of the gate electrode and is ohmically connected thereto at a plurality of discrete locations. This spine has the effect of diminishing the resistive (R), inductive (L) and capacitive (C) transmission line characteristics of the distributed gate electrode structure. In typical IGT constructions, accommodating the spine requires that the separation be increased between those active cells located along opposite sides of the gate electrode portions overlain by this spine. Thus, there is created a larger volume of drift region situated under the gate electrode spine. Unfortunately this larger drift region volume supports an increased minority carrier concentration which produces the disproportionately high reverse current density in the cells located proximate the gate electrode spine.

A second hot spot on the typical IGT is situated at the site adjacent the metal gate electrode pad. This metal gate electrode pad comprises a portion of the distributed gate electrode structure to which electrical connection of an external lead wire is conveniently made. A blocking region of the same conductivity type as the base region underlies the gate electrode pad and is in turn underlain by a portion of the drift region, thereby providing a three layer construction for preventing main device current from flowing to the gate electrode pad. A large volume of drift region also exists proximate the gate electrode pad and supports a high concentration of minority carriers capable of producing a disproportionately high reverse current in the manner described above. Hence, those IGT cells located proximate the blocking region underlying the gate electrode pad also experience a high reverse current density flowing adjacent their emitter-base junctions, and thus exhibit the tendency to latch before the remaining cells in the IGT.

The third hot spot is the site on the typical IGT adjacent a metal emitter electrode pad. This emitter electrode pad, in a manner similar to the gate electrode pad, comprises a section of the emitter electrode to which connection of an external lead wire may be conveniently made. This emitter electrode pad is underlain by the same type of three layer structure as the metal gate electrode pad, but, in contrast to the metal gate electrode pad, the emitter electrode pad is ohmically connected to its underlying blocking region at a limited number of selected locations. These ohmic connections between the emitter electrode pad and the underlying blocking region route minority carriers from a portion of the drift region situated proximate the emitter electrode pad to the emitter electrode pad along paths well spaced from any neighboring cell's emitter-base junction. It has been discovered, however, that the volume of drift region situated proximate the emitter electrode pad is so large that it supports a concentration of minority carriers too high to be safely drained through the paths established by these limited ohmic contacts. Thus, a high reverse current density exists here as well, with the potential to latch those IGT cell proximate the blocking region underlying the emitter electrode pad.

OBJECTS OF THE INVENTION

A principal object of the present invention is to provide a new and improved IGD capable of reliably gate controlling and turning off a higher forward device current than an IGD constructed in accordance with the prior art.

Another object of the present invention is to provide a new and improved IGD wherein the densities of a typically high reverse current flowing adjacent the emitter-base junctions of active cells situated proximate potential "hot spot" regions of an IGD are reduced, thereby inhibiting the tendency of these cells to latch before the remainder of the cells on the device.

SUMMARY OF THE INVENTION

These and other objects of the invention are achieved through the use of a new and improved insulated gate semiconductor device (IGD), such as an IGT, having selected cells disabled and selected structural features altered to provide paths accommodating the flow of reverse current originating at sites in the drift region having atypically large concentrations of minority carriers along paths removed from any emitter-base junctions within the semiconductor device substrate. As a consequence, there is achieved a more uniform distribution of reverse current density among forward current conducting cells of the device than is found in the prior art.

In accordance with the present invention, selected cells proximate portions of a gate electrode adjoined by a metal spine, and selected cells proximate a gate electrode pad, are fabricated partially or totally devoid of emitter regions thereby precluding the formation of some or all of each cell's emitter-base junction. Thus, the emitter electrode can be disposed in ohmic contact soley with base regions of those cells or portions of cells devoid of emitter regions. These selected cells can thus accommodate reverse current flow from a drift region site of high minority carrier concentrations to the emitter electrode along paths essentially remote from any emitter-base junctions of neighboring forward current conducting cells or cell portions. This disabling of selected cells or cell portions allows them to accommodate a disproportionately large density of reverse current flow without latching, and thus they can not influence latching of the remaining cells on the wafer, even during turn-off of the IGT.

In addition to disabling selected cells, other changes are made to the structure of the IGT in the vicinity of the metal gate and emitter electrode pads. In the vicinity of the gate electrode pad, a portion of the emitter electrode is formed to overlap a blocking region which underlies the gate electrode pad. This overlap provides a safe path for reverse current remote from the emitter-base junctions of proximate cells. In the vicinity of the emitter electrode pad, it has been discovered that by fabricating a larger quantity of more evenly distributed ohmic connections between this pad and the underlying blocking region than is found in the prior art, reverse current is similarly provided a safe path remote from the emitter-base junctions of the proximate cells.

BRIEF DESCRIPTION OF THE DRAWINGS

While the specification concludes with claims defining the features of the invention that are regarded as novel, it is believed that the invention, together with further objects thereof made apparent hereinafter, will be better understood from a consideration of the following description taken in conjunction with the drawing figures, in which:

FIG. 3 is a cross-sectional view of a second portion of the IGT of FIG. 2;

FIG. 4 is a plan view of a third portion of the IGT of FIG. 2; and

FIG. 5 is a cross-sectional view of the IGT of FIG. 4 taken along line 5—5.

DETAILED DESCRIPTION

Figure 1:
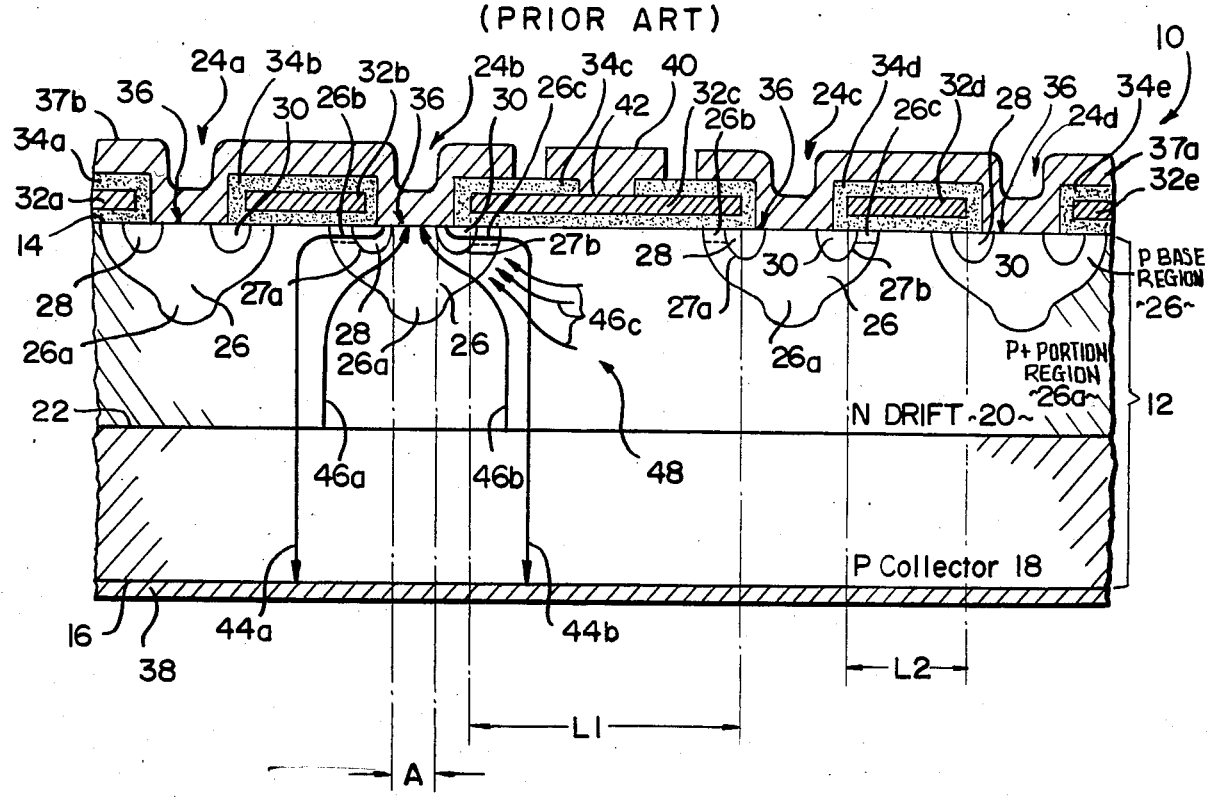
FIG. 1 is a cross-sectional view of an IGT constructed in accordance with the prior art.

Referring now to the drawings, FIG. 1 shows a portion of an IGT 10 including a silicon semiconductor wafer 12 having a major surface 14 overlying an N conductivity type drift region 20, and an opposing major surface 16 underlying a P conductivity type collector region 18. Drift region 20 and collector region 18 adjoin at a junction 22. IGT 10 includes four substantially identical cells indicated generally at 24a-24d. Each cell includes a P conductivity type base region 26 extending from major surface 14 into drift region 20 and having a deep, central P+ portion 26a, and two N conductivity type emitter regions 28 and 30 each of which extends from major surface 14 into base region 26. Emitter regions 28 and 30 of cells 24a-24d are spaced apart from drift region 20 to form a pair of channels 26b and 26c in intervening portions of base regions 26 adjacent major surface 14. A distributed gate electrode, portions of which are indicated at 32a-32e, is insulatingly spaced from major surface 14 by an insulating region, portions of which are indicated at 34a-34e. This distributed gate electrode overlies channel portions 26b and 26c of each cell. An emitter electrode, portions of which are indicated at 37a and 37b, overlies the insulating region and makes ohmic contact with a portion 36 of each cell at major surface 14. Cell portion 36 includes surfaces of emitter regions 28 and 30 and a surface of base region 26 therebetween. A collector electrode 38 is disposed in ohmic contact with surface 16 of collector region 18. A spine 40, preferably comprising a metallic material, overlies selected portions of the gate electrode and is ohmically connected thereto at a plurality of selected locations. In FIG. 1, spine 40 is shown overlying gate electrode portion 32c and extending through insulating region portion 34c to make ohmic contact with the gate electrode portion at junction 42.

Because all typical cells operate in an identical manner, the operation of IGT 10 will be described with respect to cell 24b. To initiate a forward conducting mode of operation, an external voltage source (not shown) is used to apply a positive bias voltage to the distributed gate electrode. This bias voltage causes gate electrode portions 32b and 32c to develop electrical fields, thereby forming inversion layers of conducting electrons in underlying channel portions 26b and 26c. Concomitantly, collector electrode 38 is biased at a positive voltage with respect to emitter electrode portion 37b, thereby establishing a forward electron current flow along the paths indicated at 44a and 44b. As this forward electron current flows along paths 44a and 44b, collector region 18 injects hole carriers (not shown) into drift region 20. These hole carriers form a reverse current which flows along paths indicated at 46a and 46b. Path 46a and 46b extend from drift region 20 through base region 26 to emitter electrode portion 37b. These reverse current paths are situated adjacent emitter-base junctions 27a and 27b, but do not enter into emitter regions 28 and 30. As described above, when the magnitude of the reverse current flowing along an emitter-base junction exceeds a threshold level, it causes a lateral voltage to develop along the junction which forward biases the junction, thereby causing IGT 10 to enter a latched, uncontrollable mode of operation.

As described above, it has been discovered that certain sites on a typical IGT accommodate a relatively higher density of reverse current than is found on the remainder of the IGT. Cells situated proximate these sites thus enter a latched mode of operation sooner than cells situated elsewhere on the IGT. Because all cells are connected in parallel, when any cell on the device enters the latched mode of operation, either all of the remaining cells of the device are drawn into the latched mode of operation, and gate electrode control of the forward of main device current is lost or a small group of the latched cells catastrophically fail. In accordance with the present invention, various modifications are made to the structure of the typical IGT to provide reverse current paths situated remote from the emitter-base junctions of cells proximate these sites of high density reverse current.

Specifically, these sites occur where a relatively large volume of the drift region is disposed adjoining cells having limited areas of ohmic contact between their base regions and the emitter electrode. FIG. 1 illustrates such a site 48 as that part of IGT 10 where gate electrode portion 32c is overlain by metallic spine 40. In constructing IGT 10, it is necessary to insure that emitter electrode portion 37a contacts the surface of emitter region 28 of cell 24c, and that emitter electrode portion 37b contacts the surface of emitter regions 30 of cell 24b. It is further necessary to insure that emitter electrode portions 37a and 37b are insulatingly spaced from spine 40. In the prior art, these constraints are met by fabricating gate electrode portion 32c with a lateral width L1 which exceeds the lateral width of the remaining gate electrode portions, i.e. L2 indicated at portion 32d. This increase in the width of gate electrode portion 32c allows the edges of emitter electrode portions 37a and 37b to overlap well onto insulating region portion 34c. This overlap insures the emitter electrode makes ohmic contact with the surfaces of the emitter regions of the cells proximate gate electrode portion 32c, while allowing adequate space to separate the emitter electrode portions from gate metal spine 40. This increase in the width of gate electrode portion 32c, however, also has the effect of increasing the distance between cells located along its opposite sides, i.e. the distance between cells 24b and 24c.

This relatively wider gate electrode portion 32c overlies a relatively large volume of drift region 20 situated at site 48 between cells 24b and 24c. *This large drift region volume supports a large concentration of injected hole carriers, thus resulting in a higher reverse current in cells 24b and 24c than is present in cells 24a and 24d.* However, the area of contact A between emitter electrode portion 37b and the surface of base region 26 of cell 24b, through which the reverse current indicated, for example at 46c, can drain, is typically the same as in all other cells in IGT 10. Thus, the reverse current flowing along path 46b, contributed to by paths 46c, has a much higher density than the reverse current flowing, for example, along path 46a. This high reverse current increases even further when the bias voltage is removed from the gate electrode, (i.e. at turn-off), and hole carriers stored at site 48 in drift region 20 drain, for example, along path 46b. Due to this higher reverse current density, emitter-base jucntion 27b between emitter region 30 and base region 26 of cell 24b will become forward biased before, for example, the corresponding junctions in cells 24a and 24d, and even before junction 27a adjacent emitter region 28 of cell 24b. It will be apparent to those skilled in the art that cell 24c, situated adjacent spine 40, also accommodates an atypically dense reverse current adjacent its junction 27a and has a similar tendency to latch before other cells in IGT 10.

Figure 2:
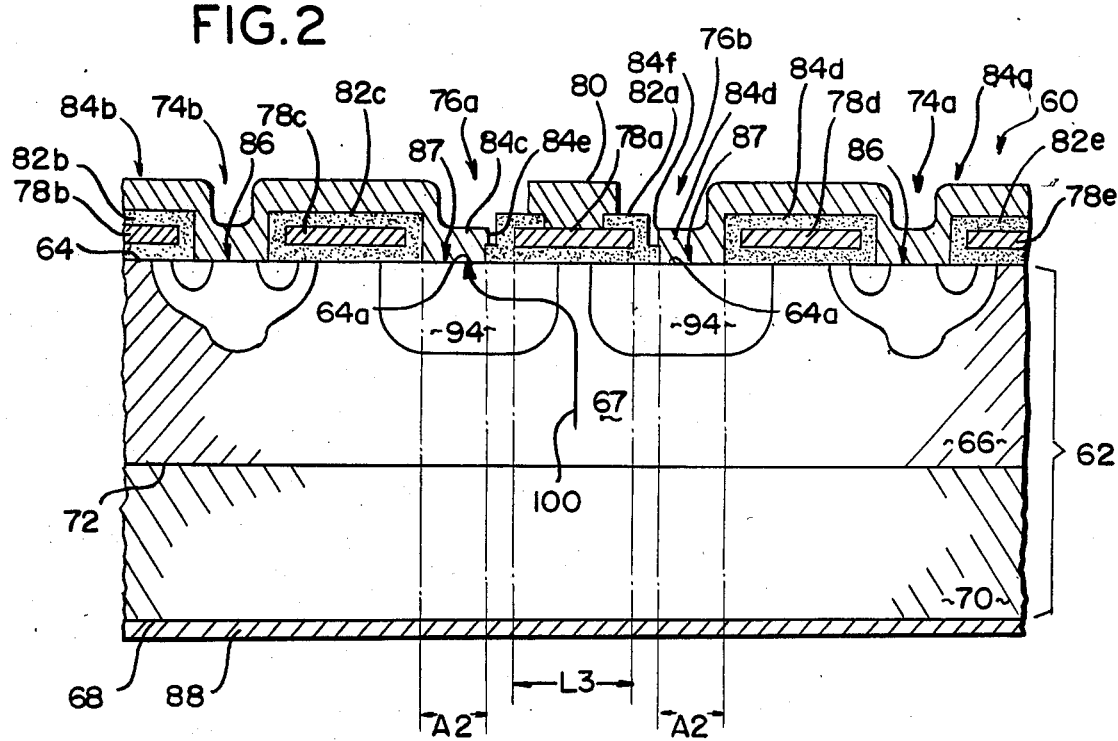
FIG. 2 is a cross-sectional view of a first portion of an IGT constructed in accordance with the present invention.

FIG. 2 shows a portion of an IGT 60 corresponding to the portion of IGT 10 shown in FIG. 1 (i.e. proximate a portion of a gate electrode adjoined by a metal spine), and constructed in accordance with the present invention. IGT 60 includes a silicon semiconductor wafer 62 having a major surface 64 overlying an N conductivity type drift region 66 and an opposing major surface 68 of a P conductivity type collector region 70 in ohmic contact with a collector electrode 88. Drift region 66 and collector region 70 adjoin at a junction 72. A pair of cells, indicated generally at 74a and 74b, are constructed indentically to cells 24a–24d of FIG. 1. In accordance with the present invention, those cells proximate the gate electrode portion 78a overlain by spine 80, a pair of which are indicated at 76a–76b, are constructed devoid of emitter regions at least in their portions overlain by gate electrode portion 78a. Preferably however, these cells are constructed completely devoid of emitter regions, leaving a P conductivity type region 94, as is shown in the case of cells 76a and 76b. A distributed gate electrode, portions of which are indicated at 78a–78e, is insulatingly spaced from major surface 64 by an insulating region, portions of which are indicated at 82a–82e. A distributed emitter electrode, portions of which are indicated at 84a and 84b, overlies the insulating region and makes ohmic contact with portions 86 of cells 74a and 74b, and portions 87 of cells 76a and 76b. It will be noted that emitter electrode portions 84c and 84d contact solely base region at surface portions 64a of major surface 64, where they otherwise would have contacted emitter regions. Due to the nature of the process used to construct cells 76a and 76b, their respective emitter regions 94 have the flat-bottomed, relatively wide shape shown in FIG. 2.

Because no emitter regions exist at cell surface portions 64a adjacent spine 80, the alignment of edges 84e and 84f of emitter electrode portions 84b and 84a, respectively, is not critical. Therefore, gate electrode portion 78a can be fabricated with a lateral width L3 equal to those of the remaining gate electrode portions. Because gate electrode portion 78a is narrower than portion 32c (FIG. 1), cells 76a and 76b are spaced closer together than are cells 24b and 24c (FIG. 1). Thus, there is a smaller volume of drift region situated at a site 67 underlying gate electrode portion 78a than is situated at side 48 of FIG. 1. Further, there is a larger area of ohmic contact A2 between emitter electrode portions 84a-84b and the exposed surfaces of base region 94 of cells 76a and 76b, respectively, than is found in IGT 10 of FIG. 1.

The operation of cells 76a and 76b is identical, and will therefore be described only with respect to cell 76a. Because of the relatively smaller area of drift region situated at site 67 underlying gate electrode portion 78a, the reverse current flowing along a path 100 will have a relatively lower density than the reverse current flowing along path 46b of FIG. 1. Further, path 100 does not lie adjacent any emitter-base junction of cell 76a, but passes directly through base region 94 to terminate at the larger contact area A2 of emitter electrode portion 84c with cell surface portion 64a. Thus, this reverse current cannot cause cell 76a to enter a latched state of operation as occurred with cell 24b of IGT 10 (FIG. 1). Accordingly, IGT 60, constructed in accordance with the present invention, can reliably gate control and turn off a larger main device current than IGT 10 constructed in accordance with the prior art.

FIG. 3 shows a portion of IGT 60 proximate a gate electrode pad structure indicated generally at 102. Pad structure 102 includes a metal pad 104 (shown in part) connected at a remote location (not shown) to the gate electrode portions, typically through the metal gate electrode spine (i.e. spine 80 of FIG. 2). Pad 104 is insulated from major surface 64 of IGT 60 by an insulating region 106. A P conductivity type blocking region 108 underlies insulating region 106 and is in turn underlain by a portion of drift region 66 situated at a site 69. The portion of IGT 60 shown in FIG. 3 includes a cell 74c constructed identically to cells 74a-74b of FIG. 2. In accordance with the present invention, this portion of IGT 60 further includes a cell 110 disposed proximate blocking region 108, cell 110 having a P conductivity type base region 112 and being totally devoid of emitter regions. Further, in accordance with the present invention an emitter electrode portion 84c is situated to overlie a portion of blocking region 108 and make ohmic contact therewith at portion 64b of major surface 64.

In operation, it has been discovered that the portion of drift region 66 situated at site 69 supports an atypically high density of hole carriers, and that these hole carriers drain through active cells adjacent blocking region 108, thereby causing the early latching described above. By constructing cell 110 devoid of any emitter region, a path 114 remote from any emitter-base junction is provided for reverse current flowing from site 69 to the portion of the emitter electrode in ohmic contact with base region 112 of cell 110. Further, by omitting emitter region from cell 110, the area of ohmic contact A4 between the emitter electrode and base region 112 is increased, thereby decreasing the density of the reverse current flowing along path 114 and also reducing the density of the excess reverse current which must be otherwise accommodated by cell 74c. In addition to omitting all emitter region from cell 110, it has been discovered that by disposing portion 84c of the emitter electrode in ohmic contact with blocking region 108, a further path 116 is established for reverse current originating at site 69, path 116 being effectively removed from any cell emitter-base junction and terminating at electrode portion 84c. The establishing of reverse current path 116 further decreases the reverse current density in the vicinity of gate electrode pad 102, and thus further decreases the density of reverse current accommodated by proximate active cells, such as cell 74c.

FIGS. 4 and 5 show a portion of IGT 60 overlain by an emitter electrode portion 84d. This portion of IGT 60 includes an emitter electrode pad 84e underlain by a P conductivity type blocking region 120 situated in wafer 62, best seen in FIG. 5. Blocking region 120 extends from major surface 64 into an area of drift region 66 situated at a site 121 underlying pad 84e. As is typically found in the prior art, the emitter electrode includes a portion 84f, situated around the periphery of pad 84e and shown in crosshatch in FIG. 4, which is disposed in ohmic contact with the underlying blocking region 120 through an underlying insulative layer region 122. In accordance with the present invention, nine additional portions of pad 84e, indicated at 84g, are distributed substantially uniformly over the area of pad 84e and also extend into ohmic contact with blocking region 120 through insulative region 122. The portion of IGT 60 shown in FIGS. 4 and 5 further includes two cells, indicated generally at 74d and 74e, which are identical in construction to cells 74a-74c (FIGS. 2 and 3). For the sake of clarity, all other features of IGT 60 have been omitted from FIG. 4.

In operation, it has been discovered that the large volume of drift region 66 situated at a site 121 supports a high concentration of hole current carriers, thereby causing an atypically dense reverse current to flow through the cells adjacent pad 84e (e.g. cells 74d-74e). By extending emitter pad portions 84g into ohmic contact with blocking region 120, in accordance with the present invention, the area of ohmic contact between the pad and the blocking region is increased dramatically. This creates additional paths for reverse current, indicated at 124, spaced from any emitter-base junctions of proximate cells. Moreover, these additional paths draw reverse current away from adjacent cells 74d-74e, thereby decreasing the density of reverse current flow therethrough along paths 126a and 126b. Consequently, in contrast to prior art constructions, premature latching of cells situated adjacent pad 84e is inhibited.

In summary, by altering the structure of an IGT in accordance with the present invention, the early latching of cells situated adjacent sites of high concentrations of minority carriers is inhibited. These structural alterations, while varying with the location of the particular site on the IGT, all have in common increasing the area of emitter electrode ohmic contact with a base conductivity type region at the wafer major surface to effectively draw high levels of reverse current away from the emitter-base junctions of neighboring active cells. Thus, the atypically dense reverse current associated with these high-concentration minority carrier sites cannot cause the early latching of cells situated proximate thereto. Since reverse current magnitude is directly related to forward current magnitude, IGTs constructed in accordance with the present invention can thus safely and reliably gate control and turn off a higher forward device current than can IGTs constructed in accordance with the prior art.

It will be obvious to those skilled in the art that, while the invention has been described with respect to an IGT, it is not so limited. It also has application in other IGDs, for example in metal-oxide-semiconductor field-effect transistors (MOSFETs). Typical MOSFETs are identical in structure to the IGT described herein with the exception of the substitution of an anode region, of the same conductivity type as the drift region, for the IGT collector region. It will be appreciated that the source, gate and drain electrodes of a MOSFET correspond to the emitter, gate and collector electrodes of an IGT, respectively. Hence, terminology used in the claims which refers to an element of any one device is intended to include the corresponding element of the other device.

It will be further obvious to those skilled in the art that, while device regions having specific conductivity types have been described and discussed, the invention is equally applicable to devices having regions of opposite conductivity types (i.e. where the "P" and "N" conductivity types are reversed) and wherein the hole and electron current paths are reversed.

While the present invention has been shown and described with reference to preferred embodiments, it will be understood that numerous modifications, changes, variations, substitutions and equivalents will occur to those skilled in the art without departing from the spirit and scope of the invention. Accordingly, it is intended that the invention herein be limited only by the scope of the appended claims.

What is claimed is:

1. In a semiconductor device comprising a silicon semiconductor substrate having a major surface overlying a drift region of first conductivity type; a plurality of active cells for conducting a main device forward current, each of said cells including a base region of second conductivity type extending from said major surface into said drift region and an emitter region of said first conductivity type extending from said major surface into said base region forming an emitter-base PN junction therewith; a distributed gate electrode insulatingly spaced from said major surface and overlying a selected portion of each of said cells such that a voltage applied to said gate electrode creates an electric field that controls the magnitude of said main device current; an emitter electrode electrically insulated from said gate electrode and making ohmic contact with exposed portions of said base and emitter regions of each of said cells at said major surface, said emitter electrode including a metallic emitter pad spaced from said major surface by an insulating layer; a blocking region of second conductivity type extending from said major surface into said drift region and underlying said emitter pad; said emitter pad including a first portion disposed in ohmic contact with said blocking region; the improvement comprising: said first portion of the emitter pad being disposed so as to surround a second portion of the emitter pad, said second portion of the emitter pad including a plurality of contact portions extending through said insulating layer to make ohmic contact with said blocking region, said contact portions being substantially uniformly distributed over the area of said second portion.

* * * * *